United States Patent
Fok

(10) Patent No.: US 12,241,746 B2
(45) Date of Patent: Mar. 4, 2025

(54) SYSTEMS AND METHODS FOR AUTOMATICALLY GENERATING MAP VALIDATION TESTS

(71) Applicant: TOYOTA RESEARCH INSTITUTE, INC., Los Altos, CA (US)

(72) Inventor: Chien-Liang Fok, Belmont, MA (US)

(73) Assignee: TOYOTA RESEARCH INSTITUTE, INC., Los Altos, CA (US)

(*) Notice: Subject to any disclaimer, the term of this patent is extended or adjusted under 35 U.S.C. 154(b) by 414 days.

(21) Appl. No.: 16/872,930

(22) Filed: May 12, 2020

(65) Prior Publication Data

US 2021/0356277 A1 Nov. 18, 2021

(51) Int. Cl.
| | |
|---|---|
| *G01C 21/32* | (2006.01) |
| *G01C 21/36* | (2006.01) |
| *G06F 30/20* | (2020.01) |
| *G06Q 10/0639* | (2023.01) |
| *G06Q 10/067* | (2023.01) |
| *G06Q 50/26* | (2012.01) |
| *G06Q 50/40* | (2024.01) |
| *G06V 20/56* | (2022.01) |

(52) U.S. Cl.
CPC ......... *G01C 21/32* (2013.01); *G01C 21/3664* (2013.01); *G01C 21/3691* (2013.01); *G06F 30/20* (2020.01); *G06Q 10/06395* (2013.01); *G06Q 10/067* (2013.01); *G06Q 50/26* (2013.01); *G06Q 50/40* (2024.01); *G06V 20/588* (2022.01)

(58) Field of Classification Search
CPC .............. G01C 21/32; G01C 21/3664; G01C 21/3691; G01C 21/3841; G06F 30/20; G06F 30/15; G06Q 10/06395; G06Q 10/067; G06Q 50/26; G06Q 50/30; G06V 20/588
USPC ............................................................. 705/6
See application file for complete search history.

(56) References Cited

U.S. PATENT DOCUMENTS

| | | | |
|---|---|---|---|
| 7,526,377 B2 | 4/2009 | Wiener | |
| 9,665,350 B1 | 5/2017 | Kalmar | |
| 10,884,427 B2* | 1/2021 | Sakaguchi | ............. G05D 1/021 |
| 10,956,855 B1* | 3/2021 | Coughran | .............. G06N 20/00 |
| 2018/0089911 A1* | 3/2018 | Rath | .................... G07C 5/0808 |
| 2018/0328745 A1* | 11/2018 | Nagy | ................. G01C 21/3415 |
| 2019/0197201 A1* | 6/2019 | Ozark | ...................... G06F 30/20 |
| 2020/0011675 A1 | 1/2020 | Yu | |
| 2020/0209864 A1* | 7/2020 | Chen | .................. G01C 21/3438 |

(Continued)

*Primary Examiner* — Gims S Philippe
(74) *Attorney, Agent, or Firm* — SHEPPARD, MULLIN, RICHTER & HAMPTON LLP; Daniel N. Yannuzzi

(57) ABSTRACT

Systems and methods are provided for validating a map via automatic test generation for multiple test route subsections. Autonomous vehicles required accurate maps. As such, new maps may be added and/or maps map be updated frequently. Verifying these maps requires testing. Maps may be validated via automatic test generation by obtaining route information identifying a route in the map for an autonomous vehicle. The route may be segmented into multiple test route subsections. Features corresponding to one or more of the test route subsections may be identified. One or more validation tests corresponding to the test route subsections may be generated based on a simulated autonomous vehicle traversing the one or more road features. For example, multiple validation tests for corresponding test route subsections may be generated and executed in parallel.

20 Claims, 7 Drawing Sheets

(56) References Cited

U.S. PATENT DOCUMENTS

2020/0240794 A1* 7/2020 Prasser ................ G05D 1/0088
2021/0124370 A1* 4/2021 Nagy ............... G08G 1/096775

* cited by examiner

SYSTEMS AND METHODS FOR AUTOMATICALLY GENERATING MAP VALIDATION TESTS

TECHNICAL FIELD

The present disclosure relates generally to validating maps, and in particular, some embodiments relate to automatically generating map validation tests corresponding to multiple test route subsections. In some embodiments, the map validation tests may be generated based on a simulated autonomous vehicle traversing one or more road features.

DESCRIPTION OF RELATED ART

Autonomous vehicles are capable of driving with little to no human input. Such vehicles utilize a combination of sensor input and map information, among other input, to safely navigate theft environment. Such vehicles depend on accurate maps. In order to verify the autonomous vehicle behaves reasonably given the new and/or updated maps as input, the maps need to be tested and validated. As autonomous vehicles become increasingly popular, and the geographic regions they are permitted to operate in expands, automatically validating new and updated maps becomes more important.

BRIEF SUMMARY OF THE DISCLOSURE

In accordance with one embodiment, a system comprises one or more physical processors programmed with computer program instructions that, when executed by the one or more physical processors, configure the system to: obtain route information identifying a route in the map for an autonomous vehicle; segment the route information into multiple test route subsections; identify one or more road features corresponding to one or more of the multiple test route subsections; and automatically generate one or more validation tests corresponding to the one or more of the multiple test route subsections based on a simulated autonomous vehicle traversing the one or more road features.

In some aspects, the system may segment multiple test route subsections based on way points. Moreover, the way points may be defined by user input and/or based on one or more road features. In some embodiments, the one or more physical processors may be further programmed with computer program instructions to automatically generate multiple validation tests for different ones of the multiple test route subsections. The multiple validation tests may be executed in parallel over the different ones of the multiple test route subsections. In some embodiments, the one or more road features may include an intersection, a lane merge, a cross walk, and/or other road features.

In accordance with one embodiment, a method comprises: upon obtaining and/or receiving a new and/or updated map, obtaining route information identifying a route in the map for an autonomous vehicle; segmenting the route information into multiple test route subsections; identifying one or more road features corresponding to one or more of the multiple test route subsections; and automatically generating one or more validation tests corresponding to the one or more of the multiple test route subsections based on a simulated autonomous vehicle traversing the one or more road features.

In some aspects, the multiple test route subsections may be segmented based on way points. Moreover, the way points may be defined by user input and/or based on one or more road features. In some embodiments, the method may further comprise automatically generating multiple validation tests for different ones of the multiple test route subsections. The multiple validation tests may be executed in parallel over the different ones of the multiple test route subsections. In some embodiments, the one or more road features may include an intersection, a lane merge, a cross walk, and/or other road features.

In general, one aspect disclosed features a non-transitory machine-readable storage medium including instructions to: obtain route information identifying a route in the map for an autonomous vehicle; segment the route information into multiple test route subsections; identify one or more road features corresponding to one or more of the multiple test route subsections; and automatically generate one or more validation tests corresponding to the one or more of the multiple test route subsections based on a simulated autonomous vehicle traversing the one or more road features.

In some aspects, the non-transitory machine-readable storage medium may include instructions to segment multiple test route subsections based on way points. Moreover, the way points may be defined by user input and/or based on one or more road features. In some embodiments, the non-transitory machine-readable storage medium may include instructions to automatically generate multiple validation tests for different ones of the multiple test route subsections. The multiple validation tests may be executed in parallel over the different ones of the multiple test route subsections. In some embodiments, the one or more road features may include an intersection, a lane merge, a cross walk, and/or other road features.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

Figure 1:
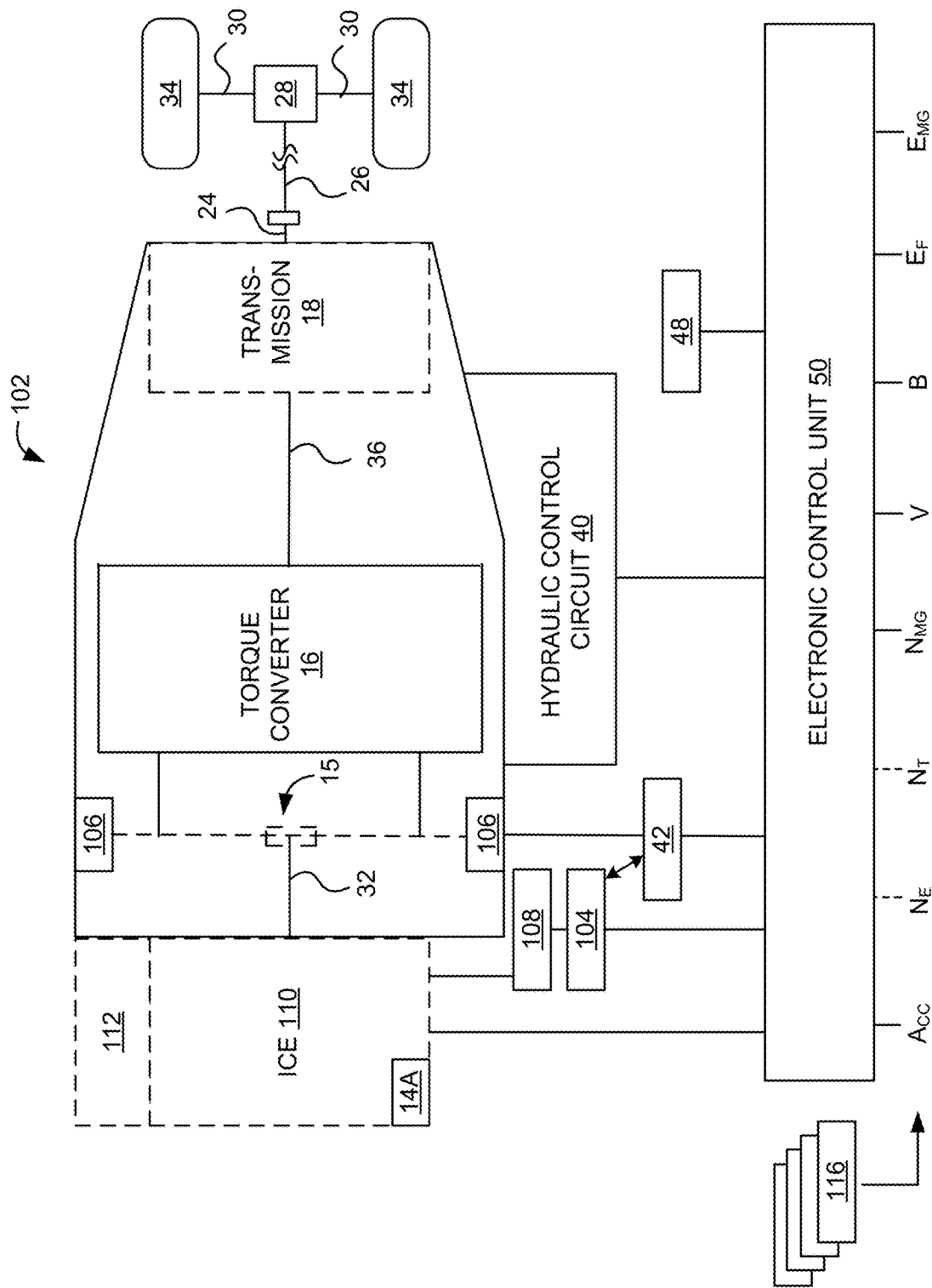
FIG. 1 illustrates an example vehicle in which embodiments of the disclosed technology may be implemented.

The figures are not exhaustive and do not limit the present disclosure to the precise form disclosed.

DETAILED DESCRIPTION

Embodiments of the systems and methods disclosed herein may be used to validate new and/or updated maps via automatic generation of validation tests for segments of the maps. The map, including the route for an autonomous vehicle, may be segmented into multiple test route subsections. The test route subsections may have and/or correspond to one or more road features. The road features for individual ones of the test route subsections may be identified such that a simulated autonomous vehicle may traverse the road features during the validation tests. These tests ensure the updated and/or new maps are compatible with the autonomous vehicle, and the autonomous vehicle is able to traverse the road features on the updated and/or new map. If one or more validation tests fail, bugs may need to be worked out prior to implementing the new and/or updated maps into the autonomous vehicle. Working out bugs prior to implementing the new and/or updated map in the autonomous vehicle saves effort, time, and money.

Some embodiments may be implemented to generate multiple validation tests for different ones of the multiple route subsections for a new map and/or an updated portion of a map. The multiple validation tests may be executed in parallel to test and/or validate the new map and/or updated portion of a map.

In some aspects, the map may include a route identified by route information. The route may be a potential route for an autonomous vehicle. In order to test the route, the route information may be segmented into multiple test route subsections. The route may be defined by way points. The way points may be the basis for segmenting the route. In some embodiments, the way points may define the beginning and/or end of a given test route subsection. In some embodiments, a given test route subsection may or may not include intermediary way points between a starting way point and/or an ending way point. By way of example, the way points may comprise latitude and/or longitude coordinates within the map.

In some embodiments, the way points may be determined heuristically based on how the autonomous vehicle navigates roads (via a simulation and/or in the real world) and/or by user input specifying the way points. By way of another example, the way points may be determined based on one or more of the road features. In some aspects, the route may be segmented into test route subsections according to the location of the road features. The test route segments may include one or more corresponding road features such that the automatically generated tests can simulate how an autonomous vehicle may handle traversing the one or more road features. The road features may comprise one or more of an intersection, a cross walk, a lane merge (e.g., a lane ending and/or becoming a turn lane, etc.), and/or other road features.

The autonomous vehicle may comprise any type of vehicle. For example, hybrid vehicles have become increasingly popular with consumers. Electric motors used in hybrid vehicles do not consume fossil fuels while stopped, e.g., an electric motor can be turned off while the hybrid vehicle is at a traffic stop. Moreover, electric motors generally consume less energy than internal combustion engines while driving in the city or in stop and go traffic. However, internal combustion engines typically provide better performance at higher speeds and can deliver more power for a given engine's weight. Hence, during crowded or jammed traffic conditions (e.g., stop and go traffic), it is generally preferred to use the hybrid vehicle's electric motor. Additionally, a hybrid vehicle's battery can be charged using regenerative braking force (that is more frequently experienced during crowded or jammed traffic conditions). At higher speeds, e.g., over approximately 64 kmh, the internal combustion engine may take over to provide better acceleration and performance that consumers may prefer when driving, e.g., on a highway. A hybrid vehicle's internal combustion engine may also be used to charge the hybrid vehicle's battery while in operation.

Some hybrid vehicles may employ an autonomous driving system designed to utilize maps validated via the system and/or methods described herein. These hybrid vehicles may utilize validated maps to enable autonomous driving. The vehicles' navigation systems may use the maps and route information to navigate the autonomous vehicle from one location to another. However, inaccurate and/or unvalidated maps lead to bugs and/or errors while the autonomous vehicle is driving resulting in serious or even catastrophic consequences.

An example vehicle 102 in which embodiments of the disclosed technology may be implemented is illustrated in FIG. 1. The vehicle depicted in FIG. 1 is a hybrid electric vehicle. However, the disclosed technology is independent of the means of propulsion of the vehicle, and so applies equally to maps for autonomous vehicles without an electric motor, and to maps for autonomous vehicles without an internal combustion engine.

FIG. 1 illustrates a drive system of a vehicle 102 that may include an internal combustion engine 110 and one or more electric motors 106 (which may also serve as generators) as sources of motive power. Driving force generated by the internal combustion engine 110 and motor 106 can be transmitted to one or more wheels 34 via a torque converter 16, a transmission 18, a differential gear device 28, and a pair of axles 30.

As an HEV, vehicle 102 may be driven/powered with either or both of engine 110 and the motor(s) 106 as the drive source for travel. For example, a first travel mode may be an engine-only travel mode that only uses internal combustion engine 110 as the drive source for travel. A second travel mode may be an EV travel mode that only uses the motor(s) 106 as the drive source for travel. A third travel mode may be an HEV travel mode that uses engine 110 and the motor(s) 106 as drive sources for travel. In the engine-only and HEV travel modes, vehicle 102 relies on the motive force generated at least by internal combustion engine 110, and a clutch 15 may be included to engage engine 110. In the EV travel mode, vehicle 102 is powered by the motive force generated by motor 106 while engine 110 may be stopped and clutch 15 disengaged.

Engine 110 can be an internal combustion engine such as a spark ignition (SI) engine (e.g., gasoline engine) a compression ignition (CI) engine (e.g., diesel engine) or similarly powered engine (whether reciprocating, rotary, continuous combustion or otherwise) in which fuel is injected into and combusted to provide motive power. A cooling system 112 can be provided to cool the engine such as, for example, by removing excess heat from engine 110. For example, cooling system 112 can be implemented to include a radiator, a water pump and a series of cooling channels. In operation, the water pump circulates coolant through the engine to absorb excess heat from the engine. The heated coolant is circulated through the radiator to remove heat from the coolant, and the cold coolant can then be recirculated through the engine. A fan may also be included to increase the cooling capacity of the radiator. The water pump, and in some instances the fan, may operate via a direct or indirect coupling to the driveshaft of engine 110. In other applications, either or both the water pump and the fan may be operated by electric current such as from battery 104.

An output control circuit 14A may be provided to control drive (output torque) of engine 110. Output control circuit 14A may include a throttle actuator to control an electronic throttle valve that controls fuel injection, an ignition device that controls ignition timing, and the like. Output control circuit 14A may execute output control of engine 110 according to a command control signal(s) supplied from an electronic control unit 50, described below. Such output control can include, for example, throttle control, fuel injection control, and ignition timing control.

Motor 106 can also be used to provide motive power in vehicle 102, and is powered electrically via a battery 104. Battery 104 may be implemented as one or more batteries or other power storage devices including, for example, lead-acid batteries, lithium ion batteries, capacitive storage devices, and so on. Battery 104 may be charged by a battery charger 108 that receives energy from internal combustion engine 110. For example, an alternator or generator may be coupled directly or indirectly to a drive shaft of internal combustion engine 110 to generate an electrical current as a result of the operation of internal combustion engine 110. A clutch can be included to engage/disengage the battery charger 108. Battery 104 may also be charged by motor 106 such as, for example, by regenerative braking or by coasting during which time motor 106 operate as generator.

Motor 106 can be powered by battery 104 to generate a motive force to move the vehicle and adjust vehicle speed. Directional force is also important for steering and may be controlled and/or manipulated by vehicle 102. Motor 106 can also function as a generator to generate electrical power such as, for example, when coasting or braking. Battery 104 may also be used to power other electrical or electronic systems in the vehicle. Motor 106 may be connected to battery 104 via an inverter 42. Battery 104 can include, for example, one or more batteries, capacitive storage units, or other storage reservoirs suitable for storing electrical energy that can be used to power motor 106. When battery 104 is implemented using one or more batteries, the batteries can include, for example, nickel metal hydride batteries, lithium ion batteries, lead acid batteries, nickel cadmium batteries, lithium ion polymer batteries, and other types of batteries.

An electronic control unit 50 (described below) may be included and may control the electric drive components of the vehicle as well as other vehicle components. For example, electronic control unit 50 may control inverter 42, adjust driving current supplied to motor 106, and adjust the current received from motor 106 during regenerative coasting and breaking. As a more particular example, output torque of the motor 106 can be increased or decreased by electronic control unit 50 through the inverter 42.

A torque converter 16 can be included to control the application of power from engine 110 and motor 106 to transmission 18. Torque converter 16 can include a viscous fluid coupling that transfers rotational power from the motive power source to the driveshaft via the transmission. Torque converter 16 can include a conventional torque converter or a lockup torque converter. In other embodiments, a mechanical clutch can be used in place of torque converter 16.

Clutch 15 can be included to engage and disengage engine 110 from the drivetrain of the vehicle. In the illustrated example, a crankshaft 32, which is an output member of engine 110, may be selectively coupled to the motor 106 and torque converter 16 via clutch 15. Clutch 15 can be implemented as, for example, a multiple disc type hydraulic frictional engagement device whose engagement is controlled by an actuator such as a hydraulic actuator. Clutch 15 may be controlled such that its engagement state is complete engagement, slip engagement, and complete disengagement complete disengagement, depending on the pressure applied to the clutch. For example, a torque capacity of clutch 15 may be controlled according to the hydraulic pressure supplied from a hydraulic control circuit (not illustrated). When clutch 15 is engaged, power transmission is provided in the power transmission path between the crankshaft 32 and torque converter 16. On the other hand, when clutch 15 is disengaged, motive power from engine 110 is not delivered to the torque converter 16. In a slip engagement state, clutch 15 is engaged, and motive power is provided to torque converter 16 according to a torque capacity (transmission torque) of the clutch 15.

As alluded to above, vehicle 102 may include an electronic control unit 50. Electronic control unit 50 may include circuitry to control various aspects of the vehicle operation. Electronic control unit 50 may include, for example, a microcomputer that includes a one or more processing units (e.g., microprocessors), memory storage (e.g., RAM, ROM, etc.), and I/O devices. The processing units of electronic control unit 50, execute instructions stored in memory to control one or more electrical systems or subsystems in the vehicle. Electronic control unit 50 can include a plurality of electronic control units such as, for example, an electronic engine control module, a powertrain control module, a transmission control module, a suspension control module, a body control module, and so on. As a further example, electronic control units can be included to control systems and functions such as doors and door locking, lighting, human-machine interfaces, cruise control, telematics, braking systems (e.g., ABS or ESC), battery management systems, and so on. These various control units can be implemented using two or more separate electronic control units, or using a single electronic control unit.

In the example illustrated in FIG. 1, electronic control unit 50 receives information from a plurality of sensors included in vehicle 102. For example, electronic control unit 50 may receive signals that indicate vehicle operating conditions or characteristics, or signals that can be used to derive vehicle operating conditions or characteristics. These may include, but are not limited to accelerator operation amount, $A_{CC}$, a revolution speed, $N_E$, of internal combustion engine 110 (engine RPM), a rotational speed, $N_{MS}$, of the motor 106 (motor rotational speed), and vehicle speed, $N_V$. These may also include torque converter 16 output, $N_T$ (e.g., output amps indicative of motor output), brake operation amount/pressure, B, battery SOC (i.e., the charged amount for battery 104 detected by an SOC sensor). Accordingly, vehicle 102 can include a plurality of sensors 116 that can be used to detect various conditions internal or external to the vehicle and provide sensed conditions to engine control unit 50 (which, again, may be implemented as one or a plurality of individual control circuits). In one embodiment, sensors 116 may be included to detect one or more conditions directly or indirectly such as, for example, fuel efficiency, $E_F$, motor efficiency, $E_{MG}$, hybrid (internal combustion engine 110+MG 12) efficiency, etc.

In some embodiments, one or more of the sensors 116 may include their own processing capability to compute the results for additional information that can be provided to electronic control unit 50. In other embodiments, one or more sensors may be data-gathering-only sensors that provide only raw data to electronic control unit 50. In further embodiments, hybrid sensors may be included that provide a combination of raw data and processed data to electronic control unit 50. Sensors 116 may provide an analog output or a digital output.

Sensors 116 may be included to detect not only vehicle conditions but also to detect external conditions as well. Sensors that might be used to detect external conditions can include, for example, sonar, radar, lidar or other vehicle proximity sensors, and cameras or other image sensors. Image sensors can be used to detect, for example, traffic signs indicating a current speed limit, road curvature, obstacles, the presence or absence of a road shoulder and so on. Still other sensors may include those that can detect road grade. While some sensors can be used to actively detect passive environmental objects, other sensors can be included and used to detect active objects such as those objects used to implement smart roadways that may actively transmit and/or receive data or other information.

Figure 2:
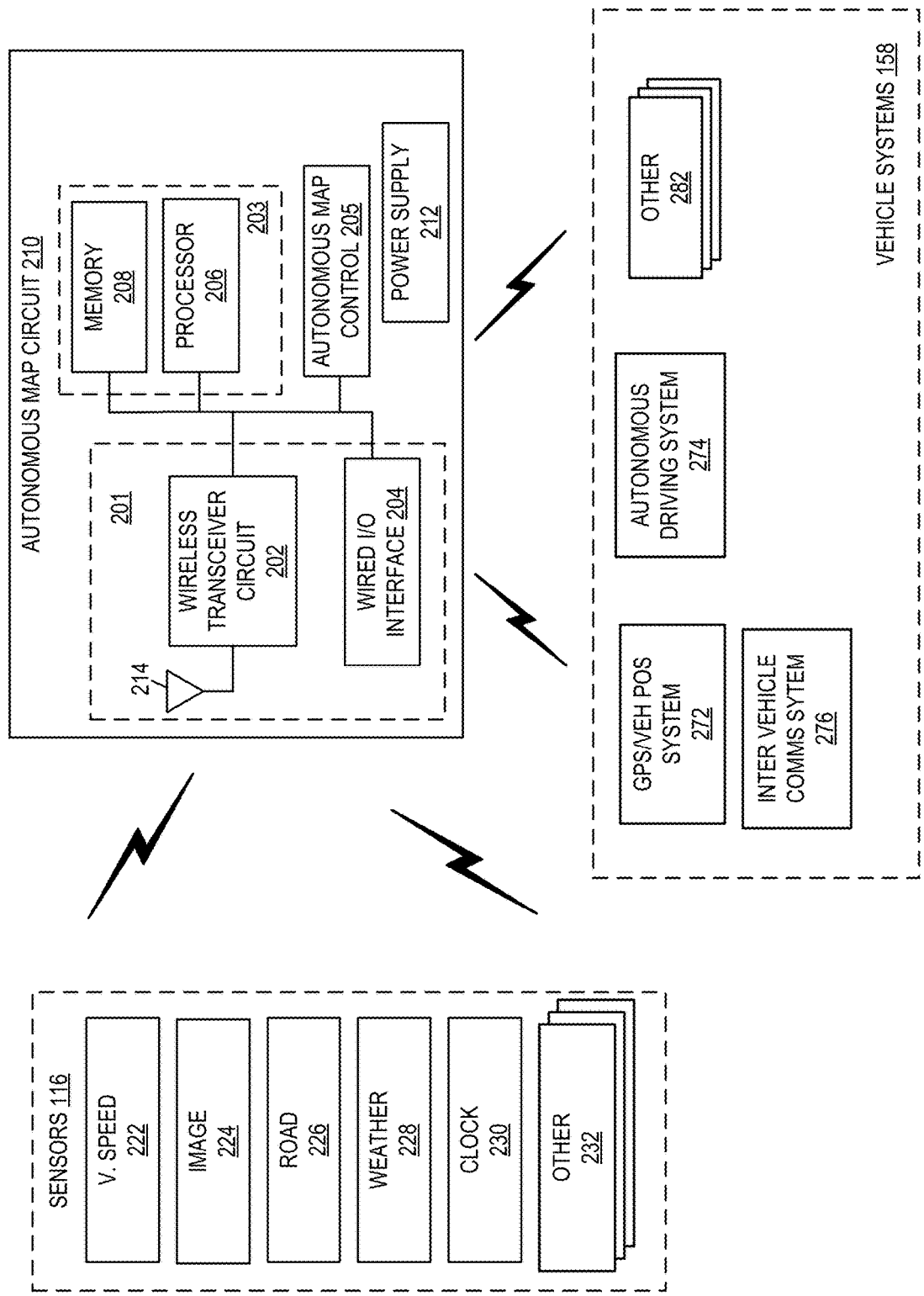
FIG. 2 illustrates an example architecture for automatically validating a map in accordance with one embodiment.

FIG. 2 illustrates an example architecture for providing validated autonomous maps in accordance with one embodiment of the systems and methods described herein. Referring now to FIG. 2, in this example, a vehicle map control system 200 includes an autonomous map circuit 210, a plurality of sensors 116, and a plurality of vehicle systems 158. Sensors 116 and vehicle systems 158 can communicate with autonomous map circuit 210 via a wired or wireless communication interface. Although sensors 116 and vehicle systems 158 are depicted as communicating with autonomous map circuit 210, they can also communicate with each other as well as with other vehicle systems. Autonomous map circuit 210 can be implemented as an ECU or as part of an ECU such as, for example electronic control unit 50. In other embodiments, autonomous map circuit 210 can be implemented independently of the ECU.

Autonomous map circuit 210 in this example includes a communication circuit 201, a processing circuit 203 (including a processor 206 and memory 208 in this example) and a power supply 212. Components of autonomous map circuit 210 are illustrated as communicating with each other via a data bus, although other communication interfaces can be included. Autonomous map circuit 210 in this example communicates with autonomous map control 205 that can be operated by the user to control the autonomous map circuit 210, for example by manual controls, voice, and the like.

Processor 206 can include a GPU, CPU, microprocessor, or any other suitable processing system. The memory 208 may include one or more various forms of memory or data storage (e.g., flash, RAM, etc.) that may be used to store the calibration parameters, images (analysis or historic), point parameters, instructions and variables for processor 206 as well as any other suitable information. Memory 208, can be made up of one or more modules of one or more different types of memory, and may be configured to store data and other information as well as operational instructions that may be used by the processor 206 to autonomous map circuit 210.

Although the example of FIG. 2 is illustrated using processor and memory circuitry, as described below with reference to circuits disclosed herein, decision circuit 203 can be implemented utilizing any form of circuitry including, for example, hardware, software, or a combination thereof. By way of further example, one or more processors, controllers, ASICs, PLAs, PALs, CPLDs, FPGAs, logical components, software routines or other mechanisms might be implemented to make up a autonomous map circuit 210.

Communication circuit 201 either or both a wireless transceiver circuit 202 with an associated antenna 214 and a wired I/O interface 204 with an associated hardwired data port (not illustrated). As this example illustrates, communications with autonomous map circuit 210 can include either or both wired and wireless communications circuits 201. Wireless transceiver circuit 202 can include a transmitter and a receiver (not shown) to allow wireless communications via any of a number of communication protocols such as, for example, WiFi, Bluetooth, near field communications (NFC), Zigbee, and any of a number of other wireless communication protocols whether standardized, proprietary, open, point-to-point, networked or otherwise. Antenna 214 is coupled to wireless transceiver circuit 202 and is used by wireless transceiver circuit 202 to transmit radio signals wirelessly to wireless equipment with which it is connected and to receive radio signals as well. These RF signals can include information of almost any sort that is sent or received by autonomous map circuit 210 to/from other entities such as sensors 116 and vehicle systems 158.

Wired I/O interface 204 can include a transmitter and a receiver (not shown) for hardwired communications with other devices. For example, wired I/O interface 204 can provide a hardwired interface to other components, including sensors 116 and vehicle systems 158. Wired I/O interface 204 can communicate with other devices using Ethernet or any of a number of other wired communication protocols whether standardized, proprietary, open, point-to-point, networked or otherwise.

Power supply 212 can include one or more of a battery or batteries (such as, e.g., Li-ion, Li-Polymer, NiMH, NiCd, NiZn, NiH$_2$, rechargeable, primary battery, etc.), a power connector (e.g., to connect to vehicle supplied power, etc.), an energy harvester (e.g., solar cells, piezoelectric system, etc.), or include any other suitable power supply.

Sensors 116 may include additional sensors that may or may not otherwise be included on a standard vehicle 102 with which the vehicle map control system 200 is implemented. In the illustrated example, sensors 116 include vehicle speed sensor 222, image sensor 224, road sensor 226, weather sensor 228, and clock 230. Additional sensors 232 can also be included as may be appropriate for a given implementation of vehicle map control system 200.

Vehicle systems 158 can include any of a number of different vehicle components or subsystems used to control or monitor various aspects of the vehicle and its performance. In this example, the vehicle systems 158 include a vehicle position system 272, an autonomous driving system 274, an inter-vehicle communications system 276, and other vehicle systems 282. Vehicle position system 272 may determine a geographic position of the vehicle, as well as its direction and speed. Vehicle position system 272 may include a global positioning satellite (GPS) system or the like. The autonomous driving system 274 may operate the vehicle 102 in autonomous driving modes including Level 2 and Level 3 modes. The autonomous driving system 274 may operate the vehicle 102 in autonomous driving modes utilizing the one or more validated maps provided by and/or to autonomous map circuit 210. The inter-vehicle communications system 276 performs automatic vehicle-to-vehicle radio communications to exchange data as described herein, and may include a dedicated short-range communications (DSRC) device or the like. The validated maps system 278 obtains and/or receives validated maps to provide to vehicle map control system 200.

Figure 3:
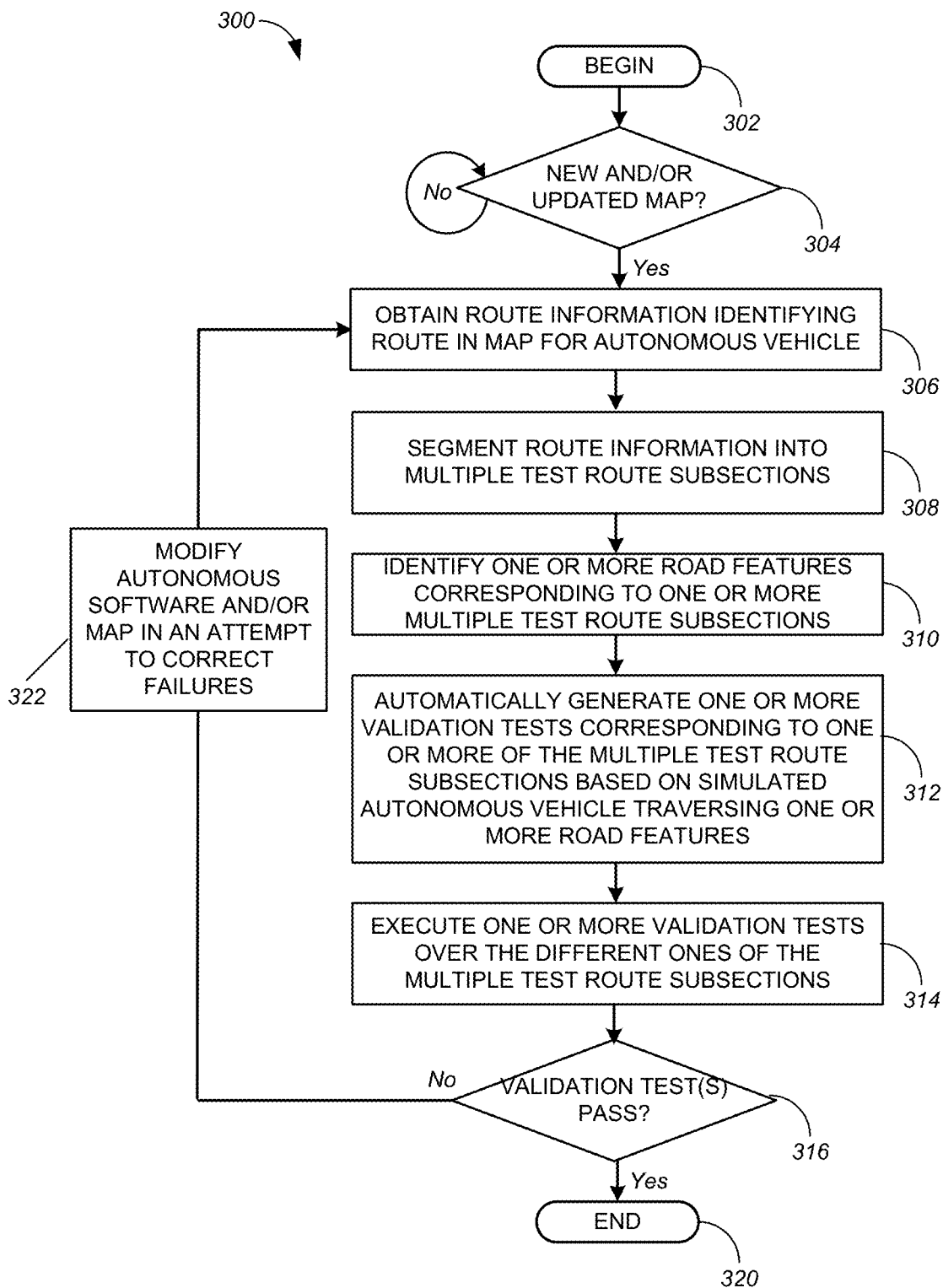
FIG. 3 is a flowchart illustrating a process for automatically validating a map according to one embodiment.

FIG. 3 is a flowchart illustrating a process 300 for automatically validating a map according to one embodiment. Process 300 may be used to validate updated and/or new maps prior to them being provided to autonomous map circuit 210. Referring to FIG. 3, the process 300 begins, at 302 with determining whether a new and/or updated map has been received, at 304. Route information identifying a route in a map for an autonomous vehicle may then be obtained at 306.

At 308, the route information may be segmented into multiple test route subsections. The test route subsections may be segmented based on one or more way points. The way points may be user determined and/or automatically determined based on one or more road features. The road features may include, for example, a lane merge, lane split, a cross walk, an intersection, and/or other features. In one embodiment, the way points may be determined by automatically identifying the road features from the map information and/or by a user setting way points at or near the road features.

One or more road features corresponding to the one or more multiple test route subsections may be identified at 310. In some embodiments, input from one or more sensors 116 (see FIG. 2) may be used to identify the one or more road features. Sensors 116 may communicate with autonomous map circuit 210 to provide information used to identify the one or more road features. In some embodiments, autonomous map circuit 210 may utilize database information, 3rd party sources, and/or other information to identify the one or more multiple test route subsections. At 312, one or more validation tests corresponding to the one or more of the multiple test route subsections may be automatically generated based on a simulated autonomous vehicle traversing one or more of the road features.

The one or more validation tests may be executed over the different ones of the multiple test route subsections at 314. Executing the one or more validation tests may include simulating an autonomous vehicle to traverse the test route subsections. In some embodiments, the simulation may be monitored and/or recorded for user review. The user may determine whether or not the validation test for a given test route subsection passes or fails based on how the simulated autonomous vehicle traverses the given test route subsection. Test route subsections, way points, and/or other aspects of the updated and/or new map may be modified, re-defined, and/or otherwise adapted if a corresponding validation test fails.

In some embodiments, multiple validation tests for multiple test route subsections may be executed in parallel at 314. In some embodiments, process 300 outputs one or more simulations of the simulated autonomous vehicle traversing the route, one or more test route subsections, one or more road features, and/or other aspects of the road corresponding to the map. The simulations may be presented to a user for review. The user may determine whether one or more of the multiple validation tests pass or fail. In some embodiments, process 300 may include determining whether the one or more validation tests pass or fail, and outputting the results.

Process 300 may be repeated for one or more of the validation tests that do not pass. The results may be used to update and/or modify the new and/or updated maps (e.g., the way points). In some embodiments, a failing result may cause the new and/or updated map to be re-segmented in a different way at 308. The new segmentation may then be tested and/or validated by steps 310-314. As such, for one or more validations tests that do not pass, the autonomous software and/or map may be modified at 322 in an attempt to correct failures before be re-tested.

Figure 4:
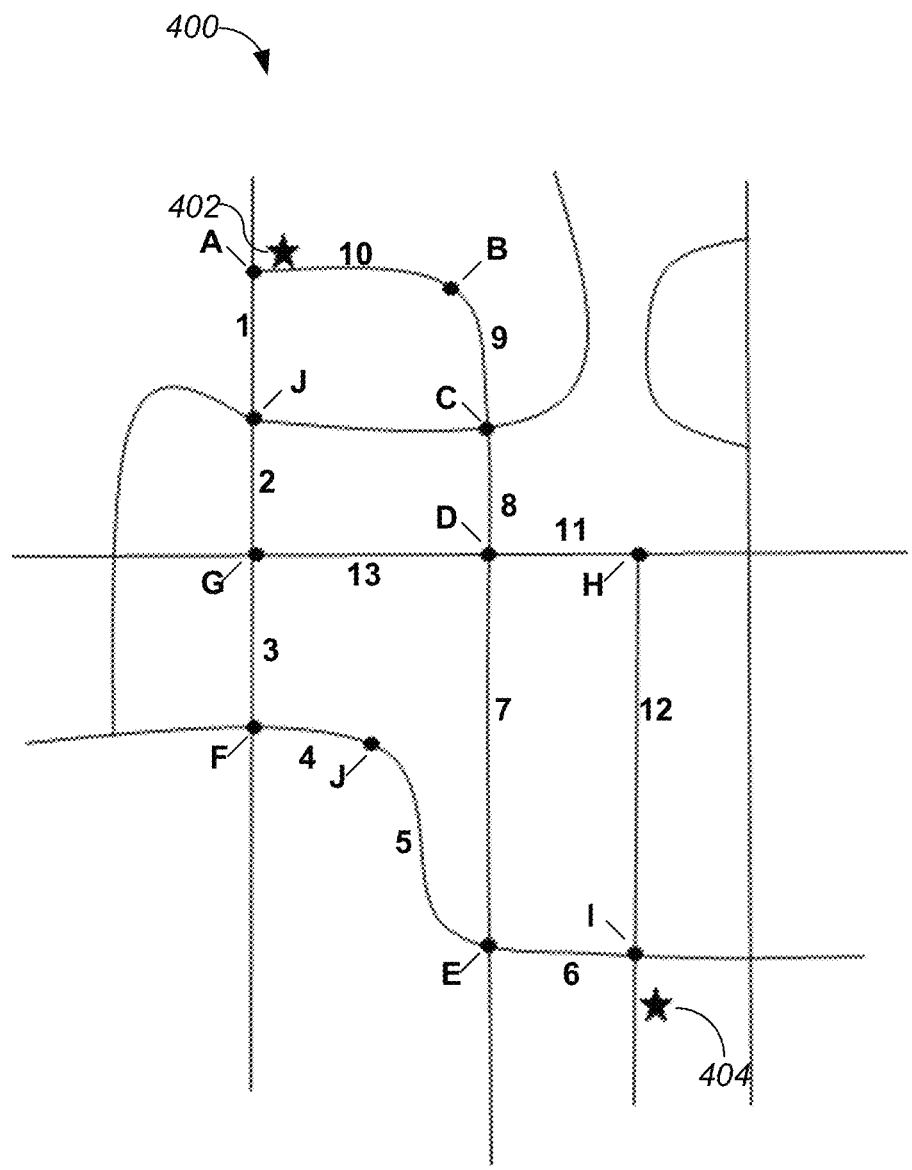
FIG. 4 illustrates a map comprising route information segmented into multiple test route subsections, according to one embodiment.

FIG. 4 illustrates a map comprising route information segmented into multiple test route subsections, according to one embodiment. Map 400 may comprise a new and/or updated portion of a map. Map 400 may include route information from 402 to 404. The route information may define one or more routes for an autonomous vehicle. For example, route information may include a route from 402 to 404 comprising test route subsections 1, 2, 3, 4, 5, and/or 6. In another embodiment, route information may include a route from 402 to 404 comprising test route subsections 10, 9, 8, 7, and/or 6. By way of another example, route information may include a route from 402 to 404 comprising test route subsections 1, 2, 13, 7, and/or 6. The route information may be segmented into test route subsections 1-13. Test route subsections 1-13 may be segmented based on way points A-J. In one example, way points A-I may be determined based on one or more road features present at or near way points A-J.

For example, way points B and J may include a lane merge before the road curves. Way points A and C-I may include intersections and/or cross walks. Validation tests may be generated for individual ones of the multiple test route subsections 1-13. Validation tests may be generated based on a simulated autonomous vehicle traversing one or more of the lane merges, intersections, cross walks, and/or other road features corresponding to test route subsections 1-13. In some embodiments, the validation tests for test route subsections 1-13 may be executed in parallel to validate map 400.

Figure 5A:
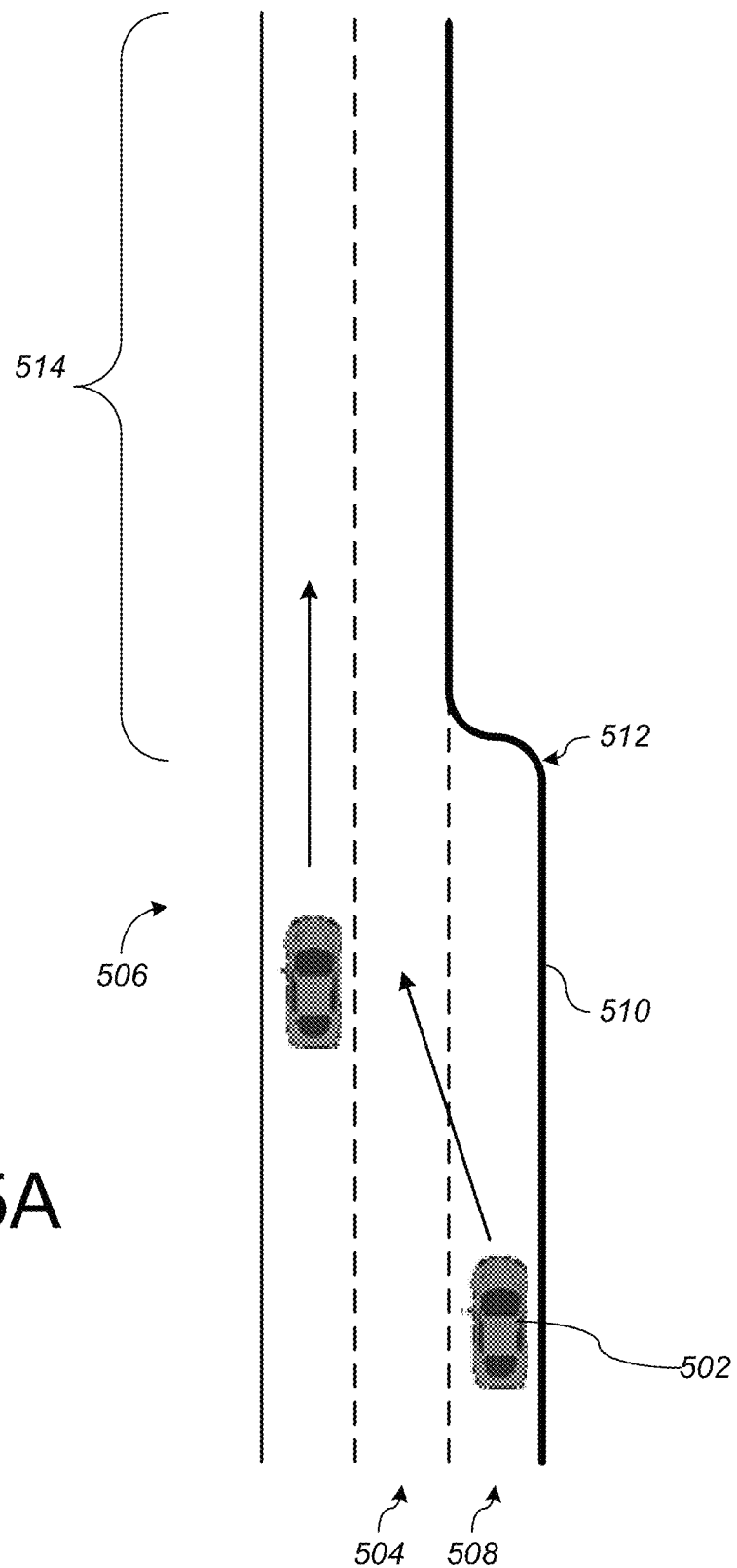
FIGS. 5A AND 5B illustrate a simulated autonomous vehicle traversing road features, according to some embodiments.
Figure 5B:
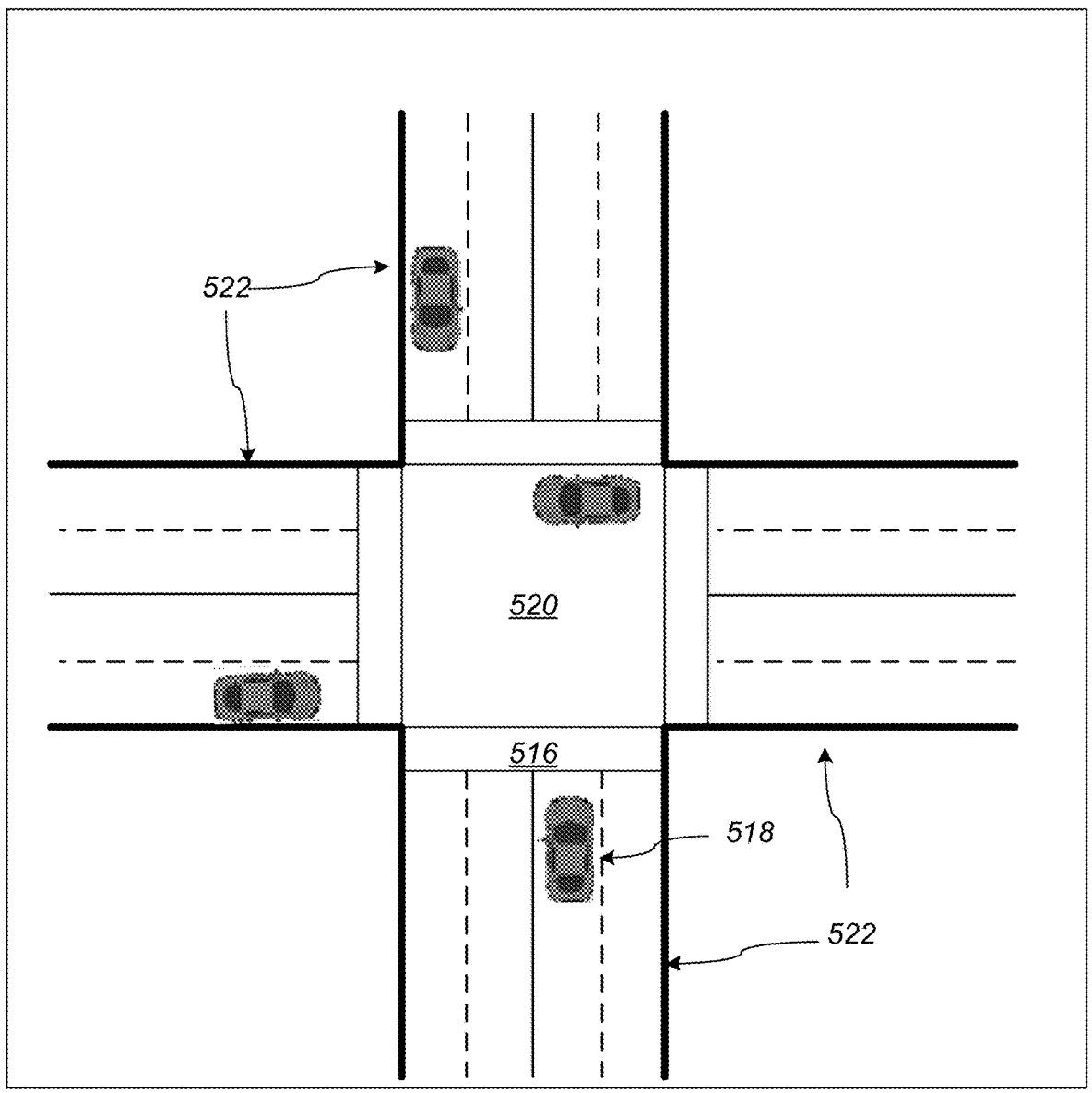

FIGS. 5A and 5B illustrate a simulated autonomous vehicle traversing one or more road features, according to some embodiments. FIG. 5A illustrates a lane merge road feature in which lane 508 ends and the vehicle must merge into lane 504. A test route subsection representing road 506 may include road feature 512. A validation test corresponding to test route subsection representing road 506 may be based on simulated autonomous vehicle 502 traversing lane merge road feature 512.

FIG. 5B illustrates intersection and cross walk road features. A test route subsection representing road section 522 may include road features 520 and/or 516. Road feature 516 may comprise a cross walk. Road feature 520 may comprise an intersection. One or more validation tests corresponding to one or more test route subsections representing road section 522 may be based on simulated autonomous vehicle 518 traversing cross walk road feature 516 and/or intersection road feature 520. In some embodiments, a cross walk may not be located at an intersection (e.g., in a school zone).

Figure 6:
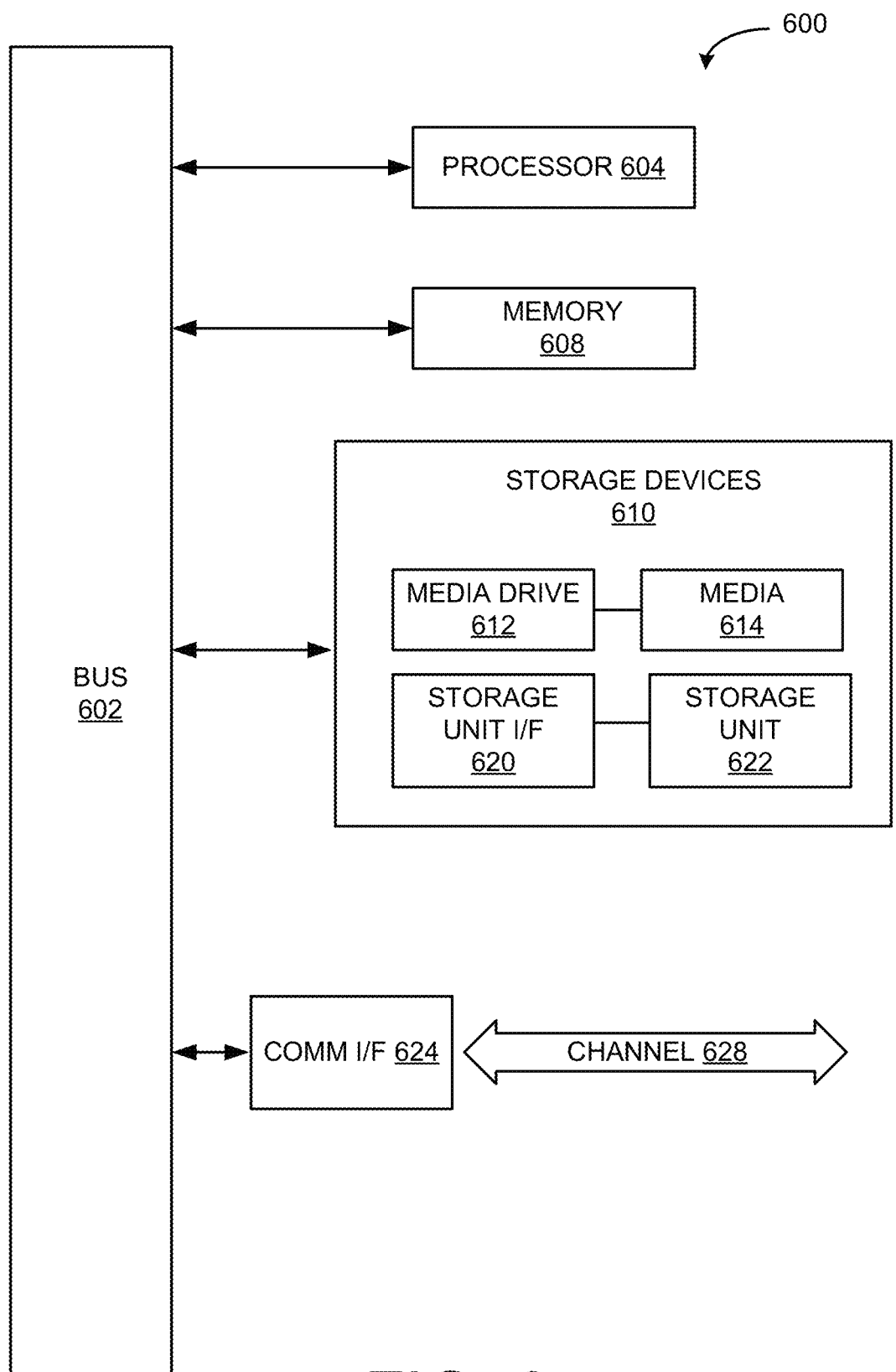
FIG. 6 illustrates an example computing component capable of carrying out the functionality described with respect thereto.

Referring now to FIG. 6, computing component 600 may represent, for example, computing or processing capabilities found within a self-adjusting display, desktop, laptop, notebook, and tablet computers. They may be found in hand-held computing devices (tablets, PDA's, smart phones, cell phones, palmtops, etc.). They may be found in workstations or other devices with displays, servers, or any other type of special-purpose or general-purpose computing devices as may be desirable or appropriate for a given application or environment. Computing component 600 might also represent computing capabilities embedded within or otherwise available to a given device. For example, a computing component might be found in other electronic devices such as, for example, portable computing devices, and other electronic devices that might include some form of processing capability.

Computing component 600 might include, for example, one or more processors, controllers, control components, or other processing devices. This can include a processor, and/or any one or more of the components making up the navigation system and its component parts, navigation server/network, and controller. Processor 604 might be implemented using a general-purpose or special-purpose processing engine such as, for example, a microprocessor, controller, or other control logic. Processor 604 may be connected to a bus 602. However, any communication medium can be used to facilitate interaction with other components of computing component 600 or to communicate externally.

Computing component 600 might also include one or more memory components, simply referred to herein as main memory 608. For example, random access memory (RAM) or other dynamic memory, might be used for storing information and instructions to be executed by processor 604. The instructions to be executed by processors 604 may include those that configure the system of the present application to validate a map and/or automatically generate validation tests for a new and/or updated portion of a map.

The instructions to be executed by processors 604 may configure the system to obtain route information identifying a route in a map for an autonomous vehicle. The route information may be segmented into multiple test route subsections. The multiple test route subsections may be segmented based on way points and/or other information. The system may automatically segment the new and/or updated maps into multiple test route subsections. In some embodiments, the instructions to be executed by processors 604 may configure the system to receive user input defining the way points. In other embodiments, the instructions to be executed by processors 604 may configure the system to determine one or more of the way points based on one or more road features. In one embodiment, for example, the way points may be determined by automatically identifying the road features from the map information and/or setting way points at or near the road features.

The road features may correspond to one or more test route subsections. By way of example, the road features may include one or more of a lane merge (e.g., a lane ending due to a road narrowing, a lane ending and becoming a turn lane, two roads merging into one such that lanes merge, etc.), an intersection (e.g., one or more roads and/or lanes meeting, with or without a stop sign and/or light), a cross walk (e.g., located at an intersection, located separate from an intersection, etc.), and/or other road features.

The instructions to be executed by processors 604 may configure the system to identify the one or more road features corresponding to one or more of the multiple test route subsections. Validation tests corresponding to the one or more of the multiple test route subsections may be generated based on a simulated autonomous vehicle traversing the one or more road features. In some embodiments, the validation tests may simulate the autonomous vehicle traversing over the route segments in addition to and/or instead of traversing the one or more road features.

According to some embodiments, instructions to be executed by processors 604 may configure the system to automatically generate multiple validations tests for different ones of the multiple test route subsections, and/or to execute the multiple validation tests over different ones of the multiple test route subsections. The validate tests may be executed in parallel such that the multiple validation tests may be executed over different ones of the multiple test route subsections at the same and/or nearly the same time (e.g., starting at the same time, starting in sequence, etc.) to validate the map.

Main memory 608 might also be used for storing temporary variables or other intermediate information during execution of instructions to be executed by processor 604. Computing component 600 might likewise include a read only memory ("ROM") or other static storage device coupled to bus 602 for storing static information and instructions for processor 604.

The computing component 600 might also include one or more various forms of information storage mechanism 610, which might include, for example, a media drive 612 and a storage unit interface 620. The media drive 612 might include a drive or other mechanism to support fixed or removable storage media 614. For example, a hard disk drive, a solid state drive, a magnetic tape drive, an optical drive, a compact disc (CD) or digital video disc (DVD) drive (R or RW), or other removable or fixed media drive might be provided. Storage media 614 might include, for example, a hard disk, an integrated circuit assembly, magnetic tape, cartridge, optical disk, a CD or DVD. Storage media 614 may be any other fixed or removable medium that is read by, written to or accessed by media drive 612. As these examples illustrate, the storage media 614 can include a computer usable storage medium having stored therein computer software or data.

In alternative embodiments, information storage mechanism 610 might include other similar instrumentalities for allowing computer programs or other instructions or data to be loaded into computing component 600. Such instrumentalities might include, for example, a fixed or removable storage unit 622 and an interface 620. Examples of such storage units 622 and interfaces 620 can include a program cartridge and cartridge interface, a removable memory (for example, a flash memory or other removable memory component) and memory slot. Other examples may include a PCMCIA slot and card, and other fixed or removable storage units 622 and interfaces 620 that allow software and data to be transferred from storage unit 622 to computing component 600.

Computing component 600 might also include a communications interface 624. Communications interface 624 might be used to allow software and data to be transferred between computing component 600 and external devices. Examples of communications interface 624 might include a modem or softmodem, a network interface (such as an Ethernet, network interface card, WiMedia, IEEE 802.XX or other interface). Other examples include a communications port (such as for example, a USB port, IR port, RS232 port Bluetooth® interface, or other port), or other communications interface. Software/data transferred via communications interface 624 may be carried on signals, which can be electronic, electromagnetic (which includes optical) or other signals capable of being exchanged by a given communications interface 624. These signals might be provided to communications interface 624 via a channel 628. Channel 628 might carry signals and might be implemented using a wired or wireless communication medium. Some examples of a channel might include a phone line, a cellular link, an RF link, an optical link, a network interface, a local or wide area network, and other wired or wireless communications channels.

In this document, the terms "computer program medium" and "computer usable medium" are used to generally refer to transitory or non-transitory media. Such media may be, e.g., memory 608, storage unit 620, media 614, and channel 628. These and other various forms of computer program media or computer usable media may be involved in carrying one or more sequences of one or more instructions to a processing device for execution. Such instructions embodied on the medium, are generally referred to as "computer program code" or a "computer program product" (which may be grouped in the form of computer programs or other groupings). When executed, such instructions might enable the computing component 600 to perform features or functions of the present application as discussed herein.

It should be understood that the various features, aspects and functionality described in one or more of the individual embodiments are not limited in their applicability to the particular embodiment with which they are described.

Instead, they can be applied, alone or in various combinations, to one or more other embodiments, whether or not such embodiments are described and whether or not such features are presented as being a part of a described embodiment. Thus, the breadth and scope of the present application should not be limited by any of the above-described exemplary embodiments.

Terms and phrases used in this document, and variations thereof, unless otherwise expressly stated, should be construed as open ended as opposed to limiting. As examples of the foregoing, the term "including" should be read as meaning "including, without limitation" or the like. The term "example" is used to provide exemplary instances of the item in discussion, not an exhaustive or limiting list thereof. The terms "a" or "an" should be read as meaning "at least one," "one or more" or the like; and adjectives such as "conventional," "traditional," "normal," "standard," "known." Terms of similar meaning should not be construed as limiting the item described to a given time period or to an item available as of a given time. Instead, they should be read to encompass conventional, traditional, normal, or standard technologies that may be available or known now or at any time in the future. Where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent. The use of the term "component" does not imply that the aspects or functionality described or claimed as part of the component are all configured in a common package. Indeed, any or all of the various aspects of a component, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. A system for validating a map, the system comprising:
   one or more physical processors programmed with computer program instructions that, when executed by the one or more physical processors, configure the system to:
   obtain route information identifying a route in the map for an autonomous vehicle;
   identify a road feature in the route;
   segment the route into multiple test route subsections according to the road feature;
   automatically generate one or more validation tests corresponding to at least one of the multiple test route subsections based on a simulated autonomous vehicle traversing the road feature;
   execute the one or more validation tests of the autonomous vehicle traversing the road feature to analyze traversability of the road feature by the autonomous vehicle; and
   upon detecting a road feature is not traversable, modify software of the autonomous vehicle to achieve traversability of the road feature.

2. The system of claim 1, wherein the multiple test route subsections are segmented based on way points.

3. The system of claim 2, wherein the one or more physical processors are further programmed with computer program instructions that, when executed by the one or more physical processors, configure the system to receive user input defining the way points.

4. The system of claim 2, wherein the one or more physical processors are further programmed with computer program instructions that, when executed by the one or more physical processors, configure the system to determine one or more of the way points based on the road feature.

5. The system of claim 1, wherein the one or more physical processors are further programmed with computer program instructions that, when executed by the one or more physical processors, configure the system to:
   automatically generate multiple validation tests for different ones of the multiple test route subsections; and
   execute the multiple validation tests in parallel over the different ones of the multiple test route subsections.

6. The system of claim 1, wherein the road feature includes an intersection, a lane merge, a lane split, or a cross walk.

7. The system of claim 1, wherein the one or more physical processors are further programmed with computer program instructions that, when executed by the one or more physical processors, configure the system to:
   determine one or more results of the one or more validation tests, wherein each result may comprise a pass or a fail; and
   output the results.

8. The system of claim 7, wherein the multiple test route subsections are segmented based on way points, and wherein the output may comprise:
   modifying at least one of the map, the one or more test route subsections, and one or more of the way points according to the one or more results.

9. The system of claim 7, wherein the one or more physical processors are further programmed with computer program instructions that, when executed by the one or more physical processors, configure the system to:
   modify an autonomous software based on the one or more results of the one or more validation tests.

10. A method for validating a map, the method being implemented in a computer system having one or more physical processors programmed with computer program instructions that, when executed by the one or more physical processors, cause the computer system to perform the method, the method comprising:
    obtaining route information identifying a route in the map for an autonomous vehicle;
    identifying a road feature in the route;
    segmenting the route into multiple test route subsections according to the road feature;
    automatically generating one or more validation tests corresponding to at least one of the multiple test route subsections based on a simulated autonomous vehicle traversing the road feature;
    executing the one or more validation tests of the autonomous vehicle traversing the road feature to analyze traversability of the road feature by the autonomous vehicle; and upon detecting a road feature is not traversable, modifying software of the autonomous vehicle to achieve traversability of the road feature.

11. The system of claim 10, wherein the multiple test route subsections are segmented based on way points.

12. The system of claim 11, wherein the method further comprises receiving user input defining the way points.

13. The system of claim 11, wherein the method further comprises determining one or more of the way points based on the road feature.

14. The system of claim 10, wherein multiple ones of the validation tests are generated in parallel over different ones of the multiple test route subsections.

15. The system of claim 10, wherein the road feature includes an intersection, a lane merge, a lane split, or a cross walk.

16. A non-transitory computer readable media including instructions for validating a map that, when executed by one or more processors, cause the one or more processors to:
  obtain route information identifying a route in the map for an autonomous vehicle;
  identify a road feature in the route;
  segment the route into multiple test route subsections according to the road feature;
  automatically generate one or more validation tests corresponding to at least one of the multiple test route subsections based on a simulated autonomous vehicle traversing the road feature;
  execute the one or more validation tests of the autonomous vehicle traversing the road feature to analyze traversability of the road feature by the autonomous vehicle; and
  upon detecting a road feature is not traversable, modify software of the autonomous vehicle to achieve traversability of the road feature.

17. The non-transitory computer readable media of claim 16, wherein the multiple test route subsections are segmented based on way points.

18. The non-transitory computer readable media of claim 17, further including instructions that, when executed by one or more processors, cause the one or more processors to receive user input defining the way points.

19. The non-transitory computer readable media of claim 17, further including instructions that, when executed by one or more processors, cause the one or more processors to determine one or more of the way points based on the road feature.

20. The non-transitory computer readable media of claim 16, wherein multiple ones of the validation tests are generated in parallel over different ones of the multiple test route subsections.

* * * * *